(12) United States Patent
Kim et al.

(10) Patent No.: US 8,411,512 B2
(45) Date of Patent: Apr. 2, 2013

(54) SEMICONDUCTOR MEMORY APPARATUS

(75) Inventors: Chul Kim, Ichon-shi (KR); Jong Chern Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 152 days.

(21) Appl. No.: 12/948,936

(22) Filed: Nov. 18, 2010

(65) Prior Publication Data

US 2011/0292707 A1     Dec. 1, 2011

(30) Foreign Application Priority Data

May 31, 2010    (KR) ........................ 10-2010-0051301

(51) Int. Cl.
*G11C 7/10*      (2006.01)
*G11C 7/22*      (2006.01)

(52) U.S. Cl. .......... 365/189.02; 365/189.14; 365/189.15

(58) Field of Classification Search .............. 365/189.02
See application file for complete search history.

(56) References Cited

U.S. PATENT DOCUMENTS

| | | | |
|---|---|---|---|
| 5,359,556 A * | 10/1994 | Kimura et al. .......... | 365/189.02 |
| 5,361,233 A * | 11/1994 | Kotani .......................... | 365/207 |
| 5,818,771 A * | 10/1998 | Yasu et al. ..................... | 365/195 |
| 5,848,011 A * | 12/1998 | Muraoka et al. ............... | 365/207 |
| 5,966,341 A | 10/1999 | Takahashi et al. | |
| 6,191,983 B1 | 2/2001 | Kitsukawa et al. | |
| 6,421,290 B2 * | 7/2002 | Khieu ........................... | 365/205 |
| 6,804,153 B2 * | 10/2004 | Yoshizawa et al. ...... | 365/189.15 |
| 6,816,397 B1 * | 11/2004 | Golz et al. ....................... | 365/51 |
| 6,956,780 B2 * | 10/2005 | Kyung .......................... | 365/205 |
| 7,603,592 B2 * | 10/2009 | Sekiguchi et al. ............. | 714/710 |
| 7,613,050 B2 * | 11/2009 | Braceras et al. .......... | 365/189.07 |
| 7,668,026 B2 * | 2/2010 | Kyung et al. .................. | 365/194 |
| 8,023,337 B2 * | 9/2011 | Chung et al. ............. | 365/189.02 |
| 8,050,114 B2 * | 11/2011 | Van Winkelhoff et al. ......................... | 365/189.14 |
| 8,059,443 B2 * | 11/2011 | McLaren et al. ................ | 365/64 |
| 2005/0057987 A1 | 3/2005 | Fujimoto et al. | |
| 2010/0080070 A1 * | 4/2010 | Parent ..................... | 365/189.02 |

FOREIGN PATENT DOCUMENTS

| | | |
|---|---|---|
| JP | 11-086533 | 3/1999 |
| KR | 100668513 B1 | 1/2007 |

* cited by examiner

*Primary Examiner* — Son Mai
(74) *Attorney, Agent, or Firm* — William Park & Associates Ltd.

(57) ABSTRACT

A semiconductor memory apparatus includes: a memory cell array including a plurality of memory cells; a bit line sense amplifier (BLSA) coupled to the memory cells in the memory cell array through a bit line; a plurality of local input/output lines coupled to the BLSA; and a switching unit coupled to the local input/output lines and configured to select a part of the local input/output lines.

9 Claims, 4 Drawing Sheets

SEMICONDUCTOR MEMORY APPARATUS

CROSS-REFERENCES TO RELATED APPLICATION

The present application claims priority under 35 U.S.C. §119(a) to Korean Application No. 10-2010-0051301, filed on May 31, 2010, in the Korean Intellectual Property Office, which is incorporated herein by reference in its entirety as if set forth in full.

BACKGROUND

1. Technical Field

The present invention relates to a semiconductor integrated circuit, and more particularly, to a semiconductor memory apparatus with an enhanced prefetch capability.

2. Related Art

The operational speed of a semiconductor memory apparatus may be enhanced by increasing a data output bandwidth. To this end, the prefetch concept has been introduced. With the prefetch operation, data are simultaneously read from a plurality of memory cells composing a unit cell array, then latched, and sequentially outputted.

As the number of data that are simultaneously read, that is, a prefetch rate increases, the data processing rate may be increased. However, the increase in the prefetch rate accompanies an increase in the number of main amplifiers and global input/output lines, which may ultimately result in sacrifice of a core area.

FIG. 1 is a conceptual diagram of a conventional semiconductor memory apparatus.

FIG. 1 illustrates a semiconductor memory apparatus with an 8-bank structure (B0 to B7). One bank 10 includes an upper bank B0_U and a lower bank B0_L, and each of the upper and lower banks B0_U and B0_L includes eight octets. Furthermore, each octet includes two unit cell arrays and a peripheral circuit.

FIG. 2 is a configuration diagram of a unit octet in the semiconductor memory apparatus shown in FIG. 1.

Each of unit cell arrays 0 and 1 includes a plurality of memory cells coupled between a bit line and a word line (not shown). Furthermore, bit-line sense amplifiers (BLSAs) SA0 to SA3 and SA4 to SA7 are connected to bit line pairs of memory cells which constitute the unit cell array.

During a read operation, the BLSAs SA0 to SA7 primarily amplify data signals from a selected memory cell and provide the amplified data signals to local input/output lines LIO_0 to LIO_7.

The data provided to the local input/output lines LIO_0 to LIO_7 are transferred to main amplifiers MA0 to MA7, which are input/output sense amplifiers, and the transferred data are secondarily amplified by the main amplifiers. When a sensing enable signal is activated, the main amplifiers MA0 to MA7 provide the secondarily amplified data signals to global input/output lines GIO_0 to GIO_7.

The data provided to the global input/output lines GIO_0 to GIO_7 are outputted to output pads according to a designated sequence. For this operation, such components as multiplexers or pipe latches may be required.

In the current 8-bank semiconductor memory apparatus, one octet comprises eight main amplifiers and eight global input/output lines as described above. Therefore, 64 main amplifiers and 64 global input/output lines are required for the upper bank, and equal numbers of main amplifiers and global input/output lines are required for the lower bank.

Therefore, one bank includes 128 main amplifiers and 128 global input/output lines.

Each of the global input/output lines is designed to have a length of several thousand μms, and the main amplifier should be designed to sufficiently drive the corresponding global input/output line. Furthermore, the width of the global input/output lines is preferably increased to achieve low impedance.

As such, the main amplifier and the global input/output line occupy a large area. Therefore, as the prefetch rate increases, the sacrificed area of the core inevitably increases. Furthermore, even when the bandwidth should be increased, the area occupied by the main amplifier and the global input/output line should be considered. Therefore, there is a limit in implementing a high-speed semiconductor memory apparatus.

SUMMARY

In one aspect of the present invention, a semiconductor memory apparatus includes: a memory cell array including a plurality of memory cells; a bit line sense amplifier (BLSA) coupled to the memory cells in the memory cell array through a bit line; a plurality of local input/output lines coupled to the BLSA; and a switching unit coupled to the local input/output lines and configured to select a part of the local input/output lines.

In another aspect of the present invention, a semiconductor memory apparatus includes a plurality of banks wherein each bank includes a plurality of memory cell array blocks, and each memory cell array block includes a bit line sense amplifier (BLSA) driven in response to a first column select signal, a switching unit configured to selectively output a half of data signals amplified by the BLSA in response to a second column select signal, and a main amplifier configured to amplify the data signals which are selectively outputted from the switching unit.

In another aspect of the present invention, a semiconductor memory apparatus has a through-silicon via (TSV) structure in which at least two semiconductor memory chips are stacked, wherein each of the semiconductor memory chips includes a plurality of memory cell array blocks, and each of the memory cell array blocks includes a switching unit configured to select a part of output signals of a bit line sense amplifier (BLSA), and a plurality of main amplifiers coupled to the switching unit.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through exemplary embodiments.

Figure 3:
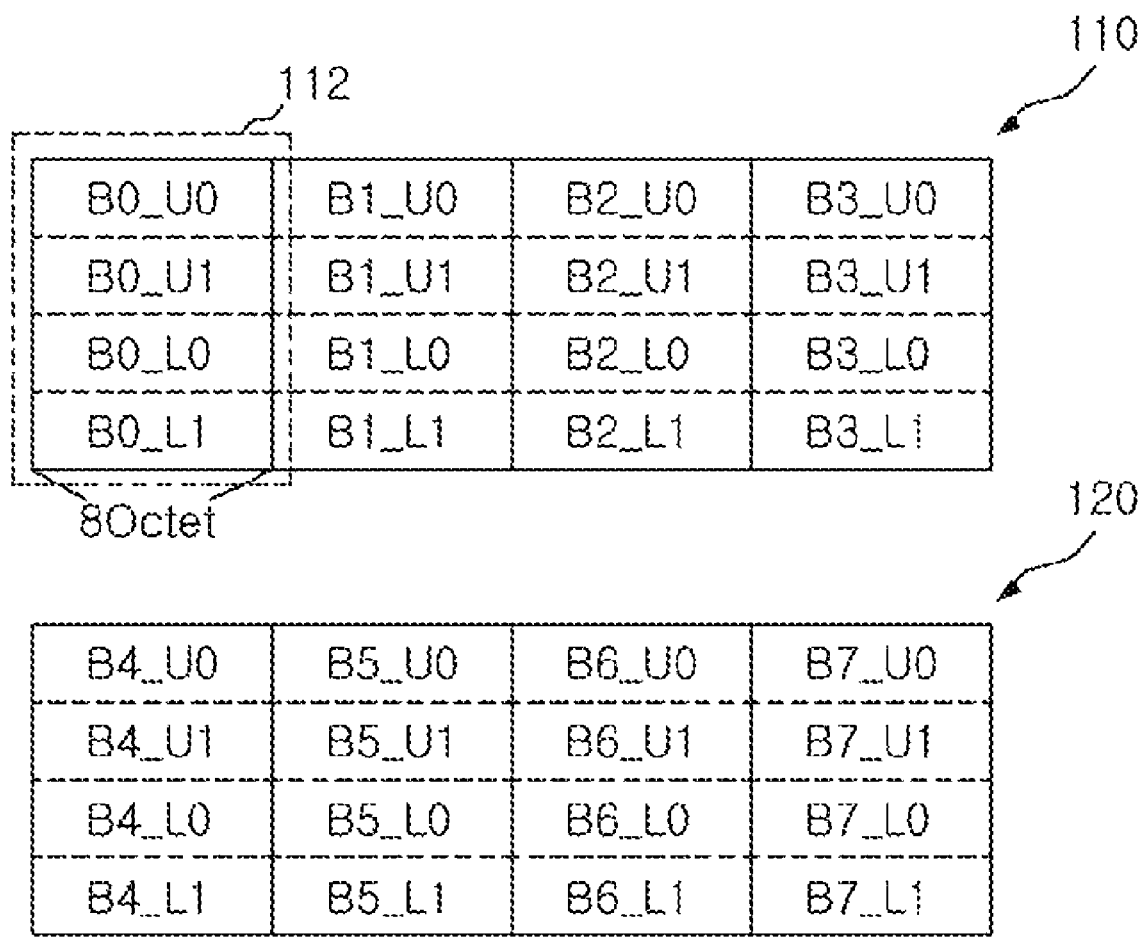
FIG. 3 is a conceptual diagram of an exemplary semiconductor memory apparatus in accordance with an embodiment of the present invention.

FIG. 3 is a conceptual diagram of an exemplary semiconductor memory apparatus in accordance with an embodiment of the present invention.

A semiconductor memory apparatus 100 according to the embodiment of the present invention may have, for example, a through-silicon via (TSV) structure, in which, while not limited thereto, at least two chips, that is, first and second chips 110 and 120 are stacked.

In the exemplary structure shown in FIG. 3, each chip includes four banks B0 to B3 or B4 to B7, and one unit bank 112 includes first and second upper banks B0_U0 and B0_U1 and first and second lower banks B0_L0 and B0_L1.

Each of the upper and lower banks may include eight octets, each of which includes two unit cell array blocks.

During an 8-bit prefetch operation, eight data bits are simultaneously read from one octet. In this case, one block has 256 main amplifiers and 256 GIO lines. In the embodiment, a switching unit for selecting a part, for example, a half, of output signals from bit line sense amplifiers (BLSAs) is introduced to reduce the numbers of main amplifiers and GIO lines. Furthermore, the semiconductor memory apparatus 100 may have a TSV structure in which a plurality of chips, e.g., two chips are stacked. In such case, even when the numbers of main amplifiers and GIO lines are reduced to one half in one chip, the same prefetch rate as a previous prefetch rate is achievable for a pair of chips.

Figure 4:
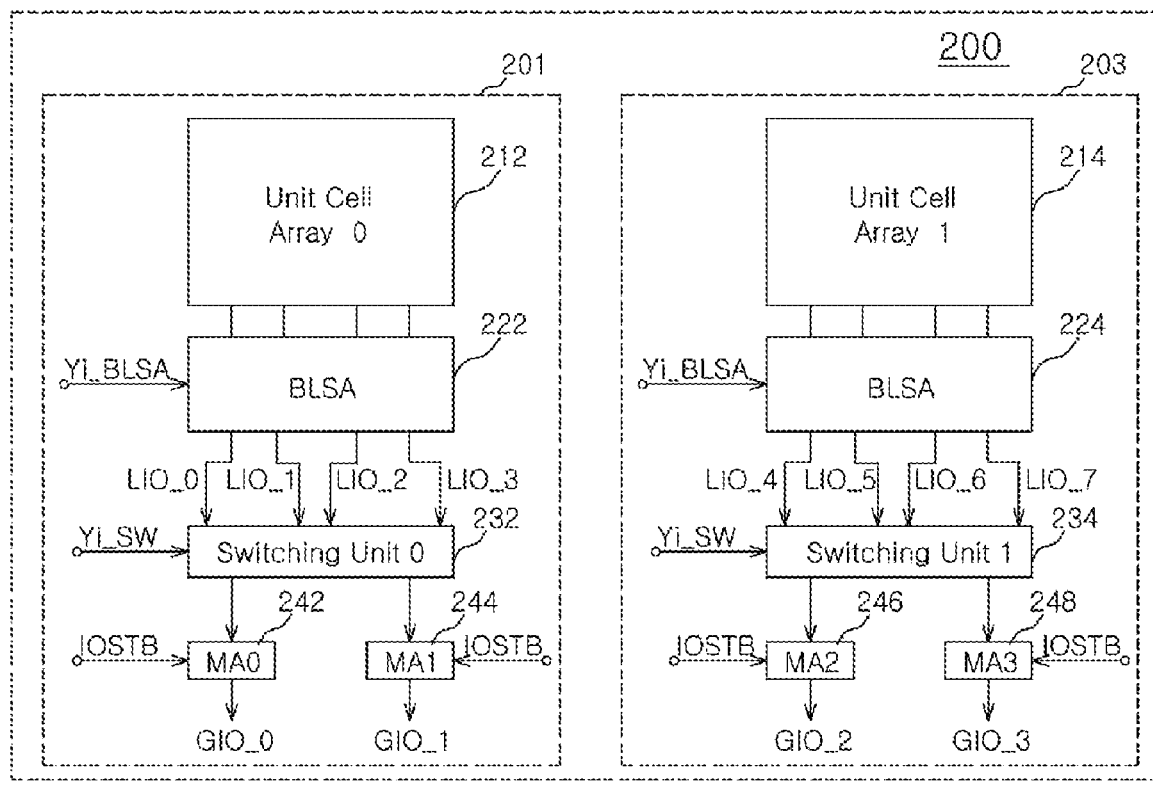
FIG. 4 is a configuration diagram of a unit octet and a peripheral circuit thereof in the semiconductor memory apparatus shown in FIG. 3.
Figure 4:
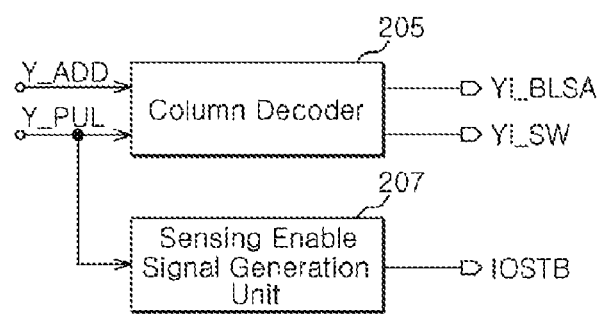

FIG. 4 is a configuration diagram of a unit octet and peripheral circuit thereof in the semiconductor memory apparatus shown in FIG. 3.

A unit octet 200 includes a pair of unit cell array blocks 201 and 203. The respective unit cell array blocks 201 and 203 include unit cell arrays 212 and 214, BLSAs 222 and 224, switching units 232 and 234, and main amplifiers 242 and 244, and 246 and 248.

The BLSAs 222 and 224 are configured to be driven by a first column select signal Yi_BLSA outputted from a column decoder 205, and the switching units 232 and 234 are configured to select and output a part, for example, one half, of data signals outputted from the BLSAs 222 and 224, in response to a second column select signal Yi_SW outputted from the column decoder 205. That is to say, while the data which are primarily amplified by the BLSAs 222 and 224 are provided to local input/output lines LIO_0 to LIO_7, in the embodiment of the invention, the local input/output lines LIO_0 to LIO_7 are not directly coupled to the main amplifiers, and only the data selected by the switching units 232 and 234 are provided to the main amplifiers 242 and 244, and 246 and 248. The switching units 232 and 234 select one half of the data from the local input/output lines LIO_0 to LIO_7 according to the second column select signal Yi_SW outputted from the column decoder 205, and provide the selected data signals to the main amplifiers 242 and 244, and 246 and 248.

Accordingly, the number of main amplifiers 242 and 244, and 246 and 248 may be reduced to a half when compared to the conventional semiconductor memory apparatus. As a consequence, the number of global input/output lines GIO_0 to GIO_3, which are provided with the data signals amplified by the main amplifiers 242 and 244, and 246 and 248, may also be reduced to a half.

The column decoder 205 adopted in the embodiment is configured to generate the first column select signal Yi_BLSA for selectively driving the BLSAs and the second column select signal Yi_SW for driving the switching units 232 and 234, in response to a column address Y_ADD and a column pulse signal Y_PUL.

The configuration of the column decoder 205 for generating the first and second column select signals Yi_BLSA and Yi_SW does not need to be changed, and the number of output signals from the column decoder 205 is twice that of the conventional semiconductor memory apparatus. One half of outputs of the column decoder 205 are used to select the BLSAs 222 and 224, and the other half are used to control the switching units 232 and 234.

Figure 1:
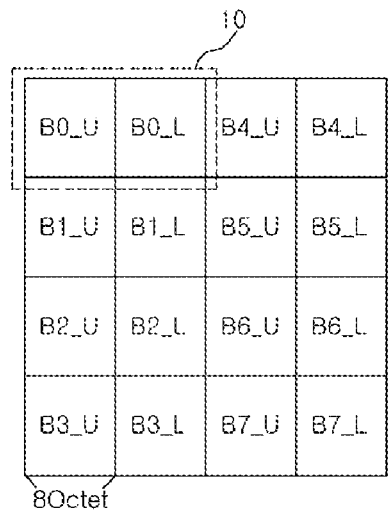
FIG. 1 is a conceptual diagram of a conventional semiconductor memory apparatus.
Figure 2:
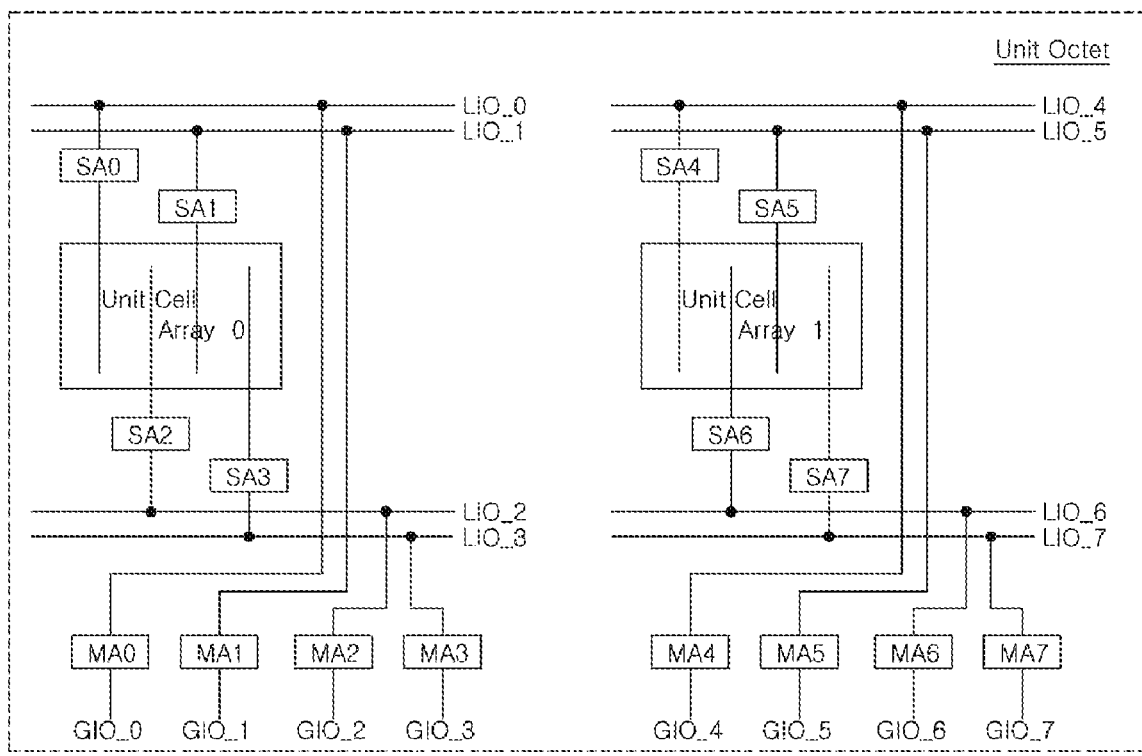
FIG. 2 is a configuration diagram of a unit octet in the semiconductor memory apparatus shown in FIG. 1.

For example, when the semiconductor memory apparatus shown in FIGS. 1 and 2 operates in a 16-bit prefetch mode, a 4-bit column select signal is required. On the other hand, the semiconductor memory apparatus according to the embodiment shown in FIGS. 3 and 5 can generate an 8-bit column select signal such that four bits may be used to drive the BLSAs and the other four bits may be used to drive the switching units.

The main amplifiers 242 and 244, and 246 and 248 are driven by a sensing enable signal IOSTB, and the sensing enable signal IOSTB is generated by a sensing enable signal generation unit 207 in response to the column pulse signal Y_PUL.

In the embodiment, the data of the memory cells included in the unit cell array 212 are primarily amplified by driving the BLSAs 222 and 224 by the first column select signal Yi_BLSA. The data primarily amplified by the BLSAs 222 and 224 are transmitted to the switching units 232 and 234 through the local input/output lines LIO_0 to LIO_3 and LIO_4 to LIO_7.

The switching units 232 and 234 are driven by the second column signal Yi_SW, select a part, for example, a half, of the data signals transmitted through the local input/output lines LIO_0 to LIO_3 and LIO_4 to LIO_7, and transfer the selected data signals to the main amplifiers 242 and 244, and 246 and 248.

The main amplifiers 242 and 244, and 246 and 248 secondarily amplify the selected data signals, and then transfer the amplified data signals to appropriate components such as pipe latches and multiplexers through the global input/output lines GIO_0 and GIO_1, and GIO_2 and GIO_3.

Since only a half of the data signals from the local input/output lines LIO_0 to LIO_3 and LIO_4 to LIO_7 are selected by the switching units 232 and 234, the numbers of the main amplifiers 242 and 244, and 246 and 248 and the global input/output lines GIO_0 to GIO_3 are reduced to a half of the conventional semiconductor apparatus. Accordingly, it is possible to save a core area which may be otherwise occupied by these components.

Figure 5A:
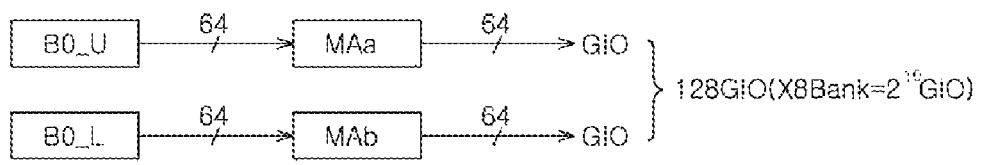
FIGS. 5a and 5b are diagrams explaining the principle of is reducing the numbers of main amplifiers and global input/output lines according to the embodiment.
Figure 5B:
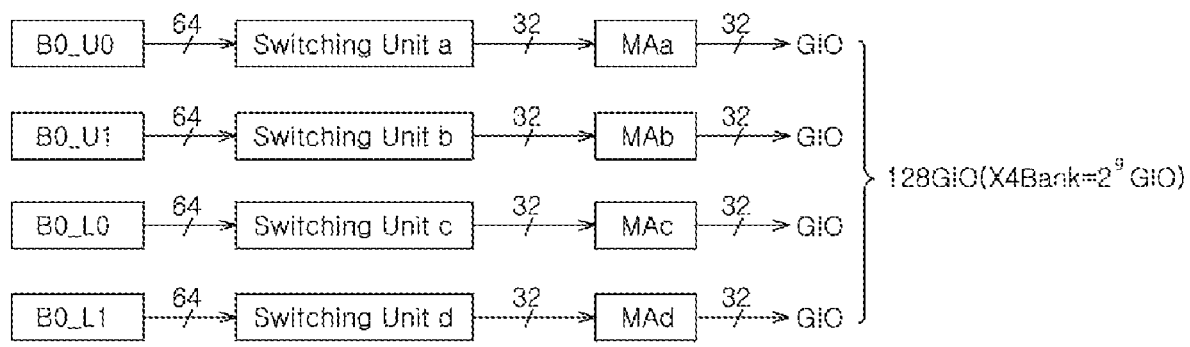

FIGS. 5a and 5b are diagrams explaining the principle of reducing the numbers of main amplifiers and global input/output lines according to the embodiment.

FIG. 5a is a diagram to explain the numbers of main amplifies and the global input/output lines required in the semiconductor memory apparatus shown in FIGS. 1 and 2.

Each of the upper and lower banks B0_U and B0_L includes eight octets, each of which includes eight local input/output lines. Therefore, 64 local input/output lines are coupled to each of the upper and lower banks B0_U and B0_L. Since the 64 local input/output lines are coupled to main amplifiers MAa and MAb, respectively, 128 main amplifiers are required for one bank. Furthermore, since global input/output lines are coupled to the respective main amplifiers MAa and MAb, 128 global input/output lines are required for one bank.

Accordingly, since the 8-bank structure requires $2^{10}$ main amplifiers and $2^{10}$ global input/output lines, the core area occupied by is these components inevitably increases.

FIG. 5b is a diagram showing the numbers of main amplifiers and global input/output lines required in the semiconductor memory device shown in FIGS. 3 and 4.

Each of the blocks includes the first and second upper banks B0_U0 and B0_U0 and the first and second lower banks B0_L0 and B0_L1. Since each of the upper and lower banks includes eight octets and eight local input/output lines are coupled to each of the octets, 64 local input/output lines are coupled to each of the upper and lower banks.

The local input/output lines are coupled to switching units a-d such that the switching units can select a half of the local input/output lines, and as a result, 32 data signals are outputted from each of the switching units a to d.

The data outputted from the switching units a-d are transferred to main amplifiers MAa to MAd. Accordingly, 128 main amplifiers are required for one block. In the semiconductor memory apparatus shown in FIGS. 3 and 4, since one chip includes four blocks, $2^9$ main amplifiers and $2^9$ global input/output lines are required.

As contrasted in FIGS. 5a and 5b, in the embodiment, the numbers of main amplifiers and the global input/output lines may be reduced to one half while the semiconductor memory apparatus operates with the same prefetch rate.

According to the embodiment, the switching units are implemented between the local input/output lines and the main amplifiers of each chip such that the data of the local input/output lines may be selectively transferred to the main amplifiers. Therefore, it is possible to significantly reduce the numbers of main amplifiers and global input/output lines coupled to the main amplifiers. This may reduce an amount of current consumption required for driving a peripheral circuit, and a design area of a unit chip may be reduced to increase a net die. Therefore, a semiconductor memory apparatus may be implemented at a reduced cost.

Moreover, when the semiconductor memory apparatus is formed to have a TSV structure, it is possible to effectively reduce an area occupied by the main amplifiers and the global input/output lines while maintaining the same prefetch rate as that of the conventional semiconductor memory apparatus.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a memory cell array including a plurality of memory cells;
a bit line sense amplifier (BLSA) coupled to the memory cells in the memory cell array through a bit line;
a plurality of local input/output lines coupled to the BLSA;
a switching unit coupled to the local input/output lines and configured to select a part of the local input/output lines; and
a column decoder configured to output a first column select signal for driving the BLSA and a second column select signal for driving the switching unit, in response to a column address and a column pulse signal.

2. The semiconductor memory apparatus according to claim 1, further comprising:
a plurality of main amplifiers coupled to the switching unit.

3. The semiconductor memory apparatus according to claim 2, further comprising:
a plurality of global input/output lines coupled to the respective main amplifiers.

4. The semiconductor memory apparatus according to claim 1, wherein the switching unit selects a half of the local input/output lines.

5. The semiconductor memory apparatus according to claim 1, wherein the semiconductor memory apparatus has a through-silicon via (TSV) structure in which at least two semiconductor memory chips are stacked.

6. A semiconductor memory apparatus including a plurality of banks, wherein each of the banks comprises a plurality of memory cell array blocks, and wherein each of the memory cell array blocks comprises:
a bit line sense amplifier (BLSA) driven in response to a first column select signal,
a switching unit configured to selectively output a half of data signals amplified by the BLSA in response to a second column select signal,
a main amplifier configured to amplify the data signals which are selectively outputted from the switching unit, and
a column decoder configured to output the first and second column select signals in response to a column address and a column pulse signal.

7. The semiconductor memory apparatus according to claim 6, further comprising:
a global input/output line configured to transfer the data signals amplified by the main amplifier to output pads.

8. A semiconductor memory apparatus having a through-silicon via TSV structure in which at least two semiconductor memory chips are stacked, wherein each of the semiconductor memory chips includes a plurality of memory cell array blocks, and wherein each of the memory cell array blocks comprises:
a switching unit configured to select a part of output signals of a bit line sense amplifier (BLSA),
a plurality of main amplifiers coupled to the switching unit, and
a column decoder configured to output a first column select signal for driving the BLSA and a second column select signal for driving the switching unit, in response to a column address and a column pulse signal, wherein the switching unit is driven according to the second column select signal and selectively outputs a half of the output signals of the BLSA.

9. The semiconductor memory apparatus according to claim 8, further comprising:
a plurality of global input/output lines coupled to the respective main amplifiers.

* * * * *